United States Patent [19]

Tanaka

[11] 4,087,665

[45] May 2, 1978

[54] SWITCHING SYSTEM

[75] Inventor: Kojiro Tanaka, Yachiyo, Japan

[73] Assignee: Kabushiki Kaisha Daini Seikosha, Japan

[21] Appl. No.: 654,222

[22] Filed: Feb. 2, 1976

[30] Foreign Application Priority Data

Feb. 10, 1975 Japan .................................. 50-17287

[51] Int. Cl.² ............................................. H01H 21/00
[52] U.S. Cl. .............................. 200/153 LB; 200/6 R; 200/11 R
[58] Field of Search .............. 200/6 R, 11 R, 153 LB, 200/292; 307/112

[56] References Cited

FOREIGN PATENT DOCUMENTS 1,244,274  7/1967  Germany ....................... 200/153 LB
1,053,620  3/1959  Germany ....................... 200/153 LB Primary Examiner—Herman J. Hohauser Attorney, Agent, or Firm—Robert E. Burns; Emmanuel J. Lobato; Bruce L. Adams

[57] ABSTRACT

A switching system comprises a switching mechanism including at least two stationary contact members, a movable contact and a rotatable switching member. The switching member rotates in one direction to urge the movable contact into contact with a first and then the second of the two stationary contacts and in the opposite direction to urge the movable contact into contact with the second and then the first stationary contact. A circuit has the two inputs thereof connected to the stationary contacts and has two outputs and is responsive to the order in which the first and second stationary contact members are contacted for generating an output signal at only a first of the two outputs when the rotatable switching member is rotated in one direction and for generating an output signal at only the second of the two outputs when the switching member is rotated in the other direction.

5 Claims, 7 Drawing Figures

SWITCHING SYSTEM

BACKGROUND OF THE INVENTION

This invention relates to a switching system having a plurality of functions operated in response to the rotary direction of a switching member, and which is usable for example, for the plus or minus time change or for the calender change.

In the conventional type of switching system, the switching system obtains a plurality of functions by the rotary direction of the stem. Also, in known systems a namely the switching element is moved in a different direction according to the rotary direction of the switching member or stem, the mechanism detecting the rotary direction by a lever and pulley and actuating switches located in different locations on the manual axis. However these mechanisms are very complicated and need a large space.

SUMMARY OF INVENTION

The main object of the present invention is to eliminate the above noted difficulty and insufficiency and to provide the simplified switching mechanism with higher reliability.

BRIEF DESCRIPTIONS OF THE DRAWINGS

DETAILED DESCRIPTION OF THE PREFERRED EMBODIMENTS

Figure 1:
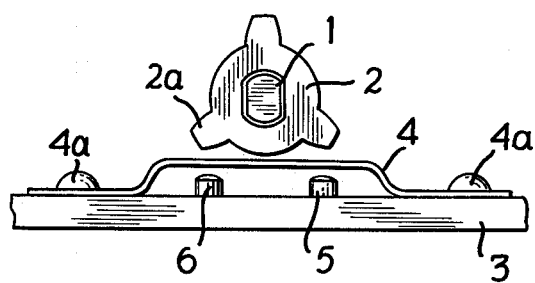
FIG. 1 is a sectional view indicating one operational state of the switching mechanism of the present invention.

FIGS. 1–4 show the sectional view of the operational states of the switching means of the present invention including manual member 1, switching member 2 of being rotated by said manual member 1, at least one protruding portion 2a is shaped on the outer peripheral portion of the switching member 2. Three portions 2a are used in the embodiment described. The switching member 2 is rotatably mounted on printed circuit board 3.

Stationary switching terminals 5 and 6 are mounted to the printed circuit board 3 connection with the protruding portion 2a, and the movable switching spring member 4 is connected to the printed circuit board 3 via the connecting portion 4a and disposed between the switching terminals 5 and 6 the switching member 2.

Therefore, the switching function is attained by the contact connection between the movable switching spring member 4 and the stationary switching terminals 5 and 6, with the two switches composed of the switching spring member 4 and the stationary switching terminals 5 and 6. The different signals are generated by the switching operation selectively operated by the switching member 2.

Referring now to the drawings, of the switching system operates as explained below.

Figure 2:
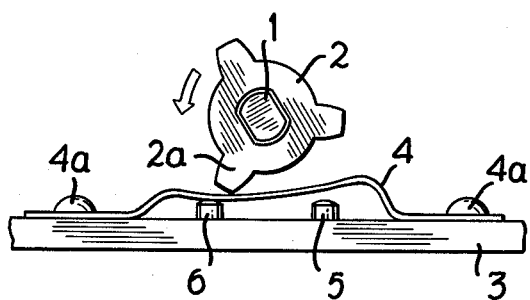
FIG. 2 is a sectional view indicating another operational state.
Figure 3:
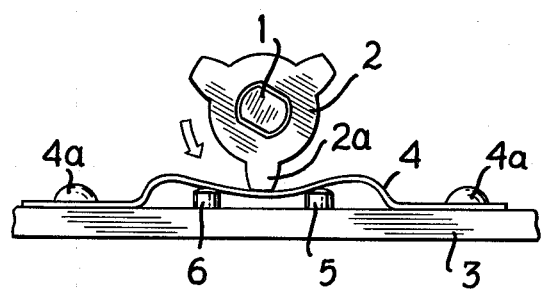
FIG. 3 is a sectional view indicating still another operational state.

FIG. 1 shows the switching means or mechanism in the normally OFF-position. In the case where the switching member 2 is rotated via the manual member 1 in the direction of arrow mark counterclock-wise, the switch spring 4 is urged down by the protruding portion 2a of the switching member 2 to contact the switching terminal 6 as shown in FIG. 2. Further continuing the rotation of the switching member 2, as indicated in FIG. 3, the switching spring member 4 is urged down whereby the switching spring member 4 contacts to the switching terminal 5, and both of the switches are are in the ON-position.

Figure 4:
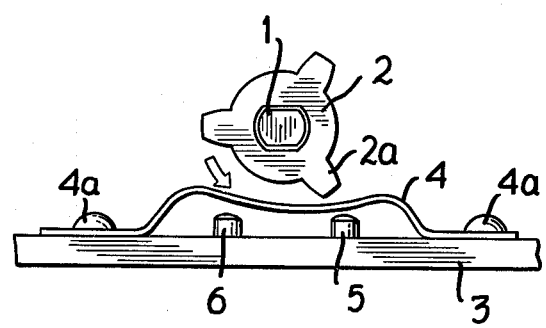
FIG. 4 is a sectional view indicating a further operational state.

Further continuing the rotation of said switching member 2 is rotated in the direction of the arrow mark as indicated in FIG. 4, the spring member 4 lifts itself from the switch terminal 6 and 5 whereby said spring member 4 is restored to the beginning position as indicated in FIG. 1.

Figure 5:
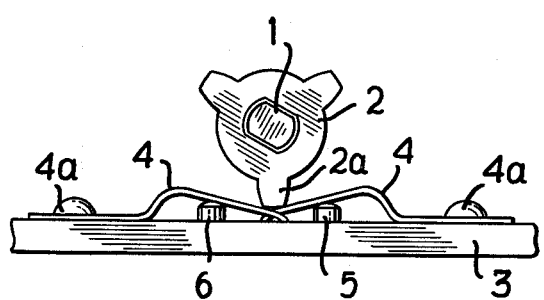
FIG. 5 is a sectional view of an alternative embodiment indicating the operational state of FIG. 3.

On the other hand, in the case where the switching member 2 is rotated in the direction of the right hand or clockwise, the spring member 4 first contacts and first lifts itself from the switching terminal 5. In the above noted construction, the spring member 4 may be formed of the separated type of two pieces as shown in FIG. 5, instead of the one body type as indicated in FIGS. 1–4. In the construction of FIG. 5, one of the two stationary terminals is first closed and the two stationary terminals are then simultaneously closed to their ON-positions. As is apparent from FIG. 5, the switching member 2 and its protruding portions 2a have sufficient lengthwise or axial extent, i.e., extent in the direction perpendicular to the plane of the drawing, so as to enable simultaneous contact with the two spring members 4,4 which are laterally spaced from one another along the length of the member 2. For example, one protruding portion 2a can initially contact and press a first one of the spring members 4 (lefthand one in FIG. 5) into contact with the stationary terminal 6 in response to counterclockwise rotation of the switching member 2 and further rotation in the same direction will bring the protruding portion 2a also into contact with the free or distal end of the second spring member 4 (righthand one in FIG. 5) so as to press it into contact with the other stationary terminal 5. This condition is shown in FIG. 5. Further rotation of the switching member 2 in the same direction will then bring the protruding portion 2a out of contact with the first spring member 4, which accordingly moves out of contact with the stationary member 6 due to elasticity of the spring member, while the protruding portion 2a remains in contact with the second spring member 4. The reverse sequence of actuation would, of course, occur if the switching member 2 were rotated in the clockwise direction.

Figure 7:
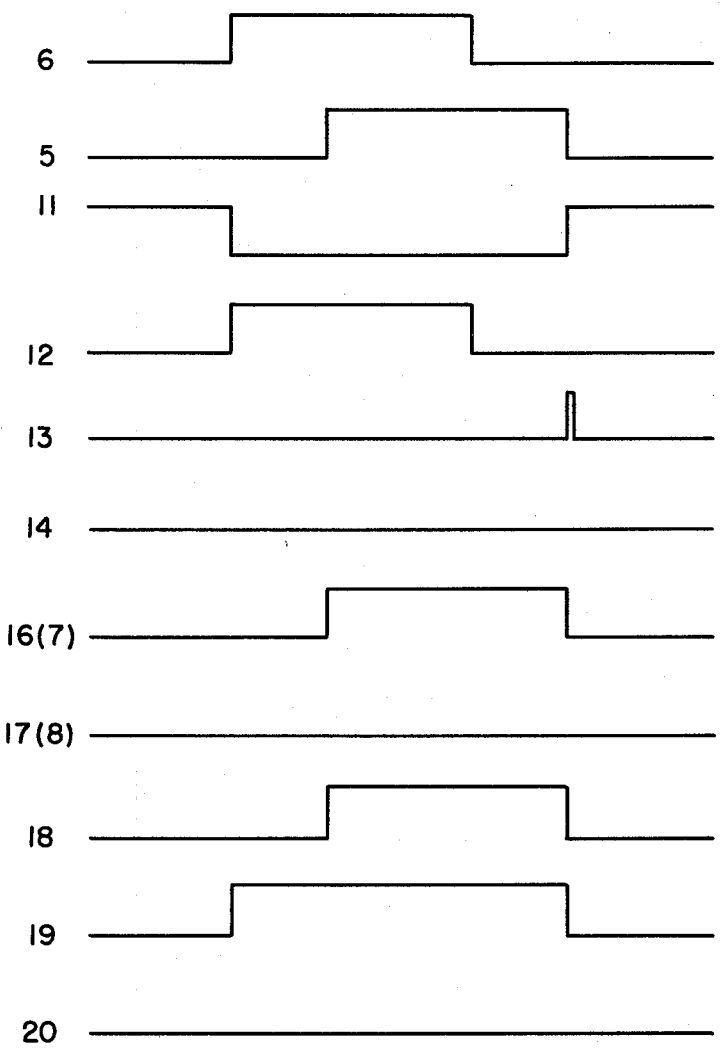
FIG. 7 is a timing diagram of the operation of the switching system of FIG. 6.
Figure 6:
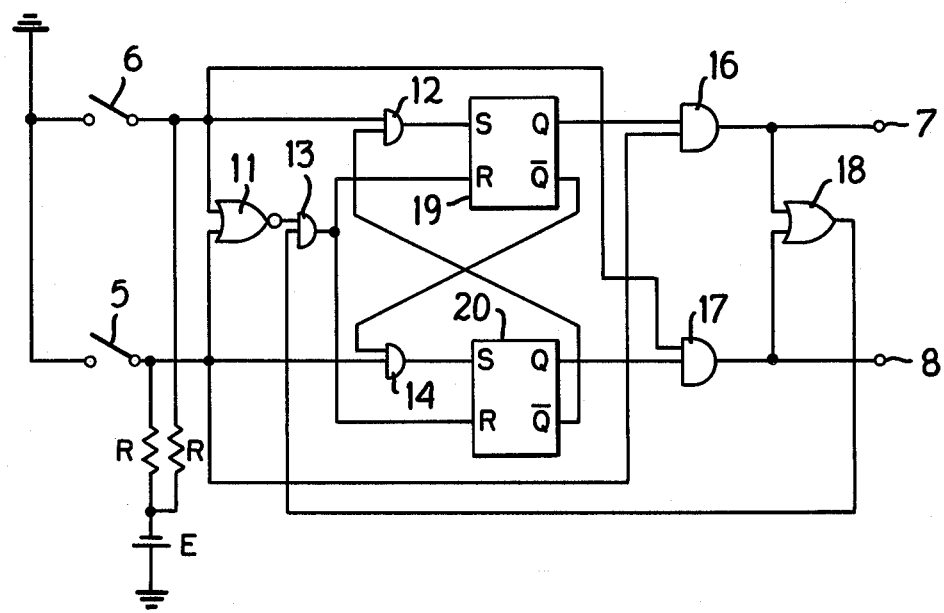
FIG. 6 is a schematic diagram of a circuit using the switching mechanism of FIGS. 1–5.

Reference is now made to the circuit means including the electrical circuit for generating the different output signals according to the rotary direction of the switching member 2 which is portrayed by the schematic of FIG. 6 and the timing diagram of FIG. 7.

FIG. 6 shows the electrical circuit and FIG. 7 shows the time chart of the electrical output of each of the connecting points in FIG. 6.

The circuit construction of FIG. 6 includes two memory circuits 19 and 20 which are reset set flip flops, the switches 5 and 6 are connected to the set terminal S of the memory circuits 19 and 20 via the AND-gate 12 and 14, the signal output terminals 7 and 8 are each connected to one output terminal Q of the memory circuits 19 and 20 via the AND-gates 16 and to 17, and the reset circuit for resetting said memory circuits 19 and 20 via OR-gate 18.

The other output terminal $\overline{Q}$ of the memory circuit 19 is connected to the AND-gate 14, the other output terminal $\overline{Q}$ of the memory circuit 20 is connected to the AND-gate 12 whereby the input to the memory circuits 19 and 20 is controlled.

The other input terminals of the AND-gates 16 and 17 are connected to the input side of each NOR-gate 11, the output of switch 6 is connected to that input of the AND-gate 16, and the output of switch 5 is connected to that input of the AND-gate 17.

The output of the NOR-gate 11 is applied to the AND-gate 13, the output of the AND-gate 13 is connected to the reset terminal R of the memory circuits 19 and 20.

The output of the OR-gate 18 having the input between signal output terminals 7 and 8 is connected to the other input terminal of AND-gate 13. The mark E indicates the power source in this drawing.

According to the above noted circuit construction, referring now to the circuit operation accompanying the time chart in FIG. 7, in the case is explained where the switch 6 is operated to the ON-position, then the switch 5 is operated to ON-position, and then further being sequentially operated to the OFF-position from the switch 6 to the switch 5.

The AND-gate 12 and 14 is awaiting for usually applying the signal of the switches 5 and 6 to the setting terminal of the memory circuits 19 and 20 by the output of the output terminal $\overline{Q}$ of the memory circuits 19 and 20 as indicated in FIG. 1.

When said switch 6 is operated to ON-position whereby the memory circuit 19 is set by the output of the AND-gate 12, the one output Q of the memory circuit 19 becomes a 1 signal, the signal $\overline{Q}$ becomes the signal "0".

The AND-gate 14 goes into the prohibited condition by the signal "0", the AND-gate 16 for receiving the output of the memory circuit 19 goes into the waiting condition according to the switch 5 not closed. AND-gate 16 is opened by the signal switch 6 of being closed without the setting condition of the memory circuit 20 whereby the AND-gate 17 is kept in the prohibited condition.

On the other hand, the OR-gate 18 receives the output of the AND-gates 16 and 17, when the one of said outputs goes to the signal "1" whereby the output of the OR-gate 18 goes to the signal "1". Therefore, the output of the AND-gate 16 is the signal "1" whereby the output of the OR-gate 18 is at the signal "1". At this time, the resetting inputs "R" of the memory circuits 19 and 20 are not reset by the output "0" of the AND-gate 13 according to the operation of the NOR-gate 11 in the ON condition of the switches 5 and 6, and are not reset by the OFF-operation of switch 5.

When the switches 5 and 6 both go to the OFF-condition, the output of the AND-gate 13 is instantaneously changed to the signal "1" thereby resetting the memory circuit and the output of the AND-gate 16 goes to the signal "0". Accordingly, when the switch 6 first goes to the ON-condition, and switch 5 goes to the ON-condition second, the output 7 goes to the signal "1", and when the switches 5 and 6 go to the OFF-condition the output 7 go to the signal "0" for the first time, while the output 8 is kept at the signal "0" during the OFF-operation of the switches 5 and 6. Further the signal "1" is generated to the output 8 by the repeat of the ON and OFF operations of said switches 5 and 6 in the opposite order.

According to the present invention, the contact relation between the spring member composed of a movable contact and the rotary direction of one switching member and a plurality of stationary switching terminals is selectively selected whereby it is possible to operate a variable change for the time and calendar in an electronic timepiece by a simple switch construction. The reliability and space factor are remarkably increased.

I claim:

1. A switching system comprising: switching means including at least two stationary contact members, a movable contact and means including a rotatable switching member for urging the movable contact into contact with a first and then a second of the two stationary contact members when said switching member is rotated in a first direction and into contact with the second and then the first stationary contact members when said switching member is rotated in a second direction opposite to said first direction; and circuit means having two input terminals connected to the two stationary contact members and two output terminals and responsive to the order in which the first and second stationary contact members are contacted by said movable contact for generating an output signal at only a first of the two outputs thereof when the rotatable switching member is rotated in said first direction and for generating an output signal at only the second of the two outputs thereof when the rotatable switching member is rotated in said second direction.

2. A switching system according to claim 1, wherein said circuit means comprises a pair of flip flops each having Q-terminals and at inputs, a first pair of AND gates each having one input connected to one stationary contact member and the output thereof connected to the set input of one flip flop, a second pair of AND gates each having on input connected to the Q terminal of one flip flop and the output connected to one circuit output and means for enabling one or the other of the two flip flops to be set in dependence upon the order in which an input signal is applied to said first pair of AND gates.

3. A switching system according to claim 2, wherein said rotatable switching member comprises a circular member having a plurality of radially extending projections along the periphery thereof.

4. A switching system according to claim 3, wherein said movable contact comprises one movable member.

5. A switching system according to claim 3, wherein said movable contact comprises two movable contact members each movable into contact with one of the two stationary contact members.

* * * * *